United States Patent
Cea et al.

(10) Patent No.: US 9,564,522 B2
(45) Date of Patent: Feb. 7, 2017

(54) NANOWIRE STRUCTURES HAVING NON-DISCRETE SOURCE AND DRAIN REGIONS

(71) Applicants: Stephen M. Cea, Hillsboro, OR (US); Annalisa Cappellani, Portland, OR (US); Martin D. Giles, Portland, OR (US); Rafael Rios, Austin, TX (US); Seiyon Kim, Portland, OR (US); Kelin J. Kuhn, Aloha, OR (US)

(72) Inventors: Stephen M. Cea, Hillsboro, OR (US); Annalisa Cappellani, Portland, OR (US); Martin D. Giles, Portland, OR (US); Rafael Rios, Austin, TX (US); Seiyon Kim, Portland, OR (US); Kelin J. Kuhn, Aloha, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 14/803,919

(22) Filed: Jul. 20, 2015

(65) Prior Publication Data
US 2015/0325648 A1    Nov. 12, 2015

Related U.S. Application Data

(62) Division of application No. 13/995,930, filed as application No. PCT/US2011/067232 on Dec. 23, 2011, now Pat. No. 9,087,863.

(51) Int. Cl.
*H01L 29/06* (2006.01)
*H01L 29/08* (2006.01)
(Continued)

(52) U.S. Cl.
CPC ....... *H01L 29/66977* (2013.01); *H01L 21/268* (2013.01); *H01L 29/0673* (2013.01);
(Continued)

(58) Field of Classification Search
CPC .............. H01L 29/66977; H01L 21/268; Y10S 977/742
(Continued)

(56) References Cited

U.S. PATENT DOCUMENTS 8,324,030 B2 * 12/2012 Bangsaruntip ......... B82Y 10/00
257/38
8,455,334 B2 * 6/2013 Bangsaruntip ......... B82Y 10/00
438/149
(Continued)

FOREIGN PATENT DOCUMENTS

TW    201115734    5/2011
TW    201123429    7/2011

OTHER PUBLICATIONS

International Search Report and Written Opinion for PCT Patent Application No. PCT/US2011/067232 Mailed Oct. 10, 2012, 9 Pages.
(Continued)

*Primary Examiner* — Moazzam Hossain
(74) *Attorney, Agent, or Firm* — Blakely, Sokoloff, Taylor & Zafman LLP

(57) ABSTRACT

Nanowire structures having non-discrete source and drain regions are described. For example, a semiconductor device includes a plurality of vertically stacked nanowires disposed above a substrate. Each of the nanowires includes a discrete channel region disposed in the nanowire. A gate electrode stack surrounds the plurality of vertically stacked nanowires. A pair of non-discrete source and drain regions is disposed on either side of, and adjoining, the discrete channel regions of the plurality of vertically stacked nanowires.

9 Claims, 9 Drawing Sheets

(51) Int. Cl.

| | | |
|---|---|---|
| *H01L 29/423* | (2006.01) | |
| *H01L 29/66* | (2006.01) | |
| *H01L 21/268* | (2006.01) | |
| *H01L 29/786* | (2006.01) | |
| *H01L 29/78* | (2006.01) | |
| *B82Y 40/00* | (2011.01) | |

(52) U.S. Cl.
CPC .... *H01L 29/0847* (2013.01); *H01L 29/42356* (2013.01); *H01L 29/42392* (2013.01); *H01L 29/66477* (2013.01); *H01L 29/66787* (2013.01); *H01L 29/7845* (2013.01); *H01L 29/7848* (2013.01); *H01L 29/78696* (2013.01); *B82Y 40/00* (2013.01); *H01L 29/7839* (2013.01)

(58) Field of Classification Search
USPC .................. 438/279; 257/E27.096; 977/938
See application file for complete search history.

(56) References Cited

U.S. PATENT DOCUMENTS

| | | | | |
|---|---|---|---|---|
| 8,709,888 | B2* | 4/2014 | Chang | B82Y 10/00 257/288 |
| 8,753,942 | B2* | 6/2014 | Kuhn | B82Y 10/00 257/24 |
| 2004/0227181 | A1* | 11/2004 | Yeo | H01L 21/8221 257/328 |
| 2006/0049429 | A1 | 3/2006 | Kim et al. | |
| 2006/0073665 | A1* | 4/2006 | Jain | H01L 21/82381 438/303 |
| 2007/0196973 | A1* | 8/2007 | Park | H01L 21/82341 438/197 |
| 2008/0099849 | A1* | 5/2008 | Kim | H01L 29/42392 257/365 |
| 2008/0135949 | A1 | 6/2008 | Lo et al. | |
| 2010/0207208 | A1 | 8/2010 | Bedell et al. | |
| 2010/0207209 | A1 | 8/2010 | Inokuma | |
| 2010/0295021 | A1* | 11/2010 | Chang | H01L 27/1203 257/24 |
| 2011/0031473 | A1 | 2/2011 | Chang et al. | |
| 2011/0062417 | A1* | 3/2011 | Iwayama | B82Y 10/00 257/24 |
| 2011/0101308 | A1* | 5/2011 | Avouris | H01L 29/4908 257/27 |
| 2011/0233522 | A1 | 9/2011 | Cohen et al. | |
| 2012/0138886 | A1 | 6/2012 | Kuhn et al. | |
| 2013/0288438 | A1* | 10/2013 | Jensen | H01L 21/268 438/197 |

OTHER PUBLICATIONS

International Preliminary Report on Patentability from PCT/US2011/067232 mailed Jul. 3, 2014, 6 pgs.
Search Report from Taiwanese Patent Application No. 101145908 dated Sep. 8, 2014, 1 pg.
Non-Final Office Action from U.S. Appl. No. 13/995,930 mailed Nov. 18, 2014, 15 pgs.
First Chinese Office Action for Application No. 201180076434.4, dated May 30, 2016, 21 pages.
First Taiwanese Office Action & Search Report for Application No. 104125951, mailed Jun. 16, 2016, 6 pages.

* cited by examiner

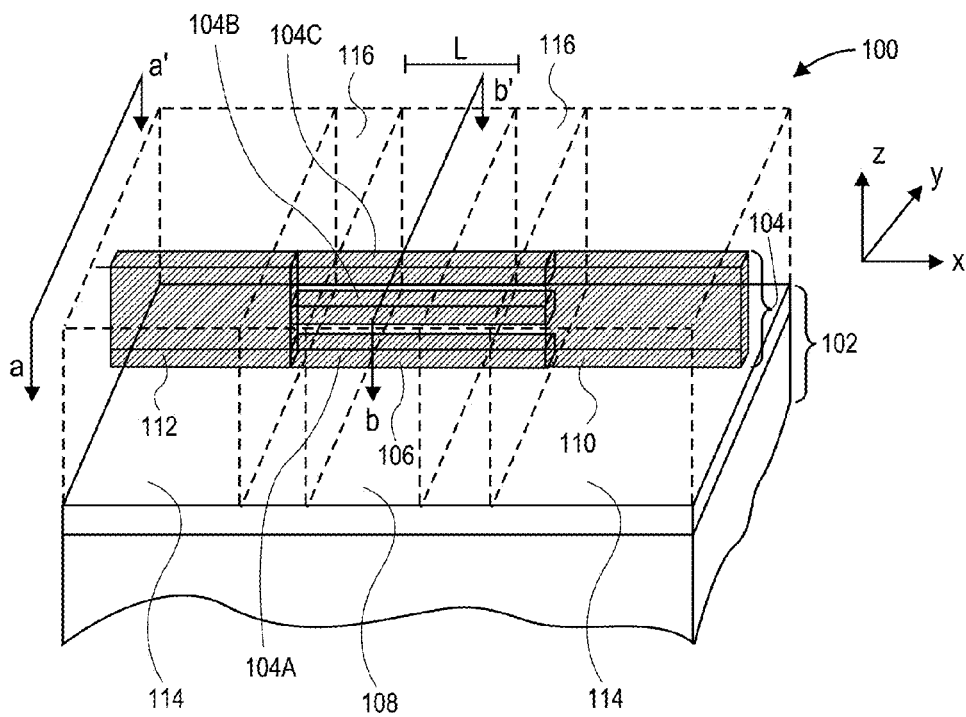
FIG. 1A
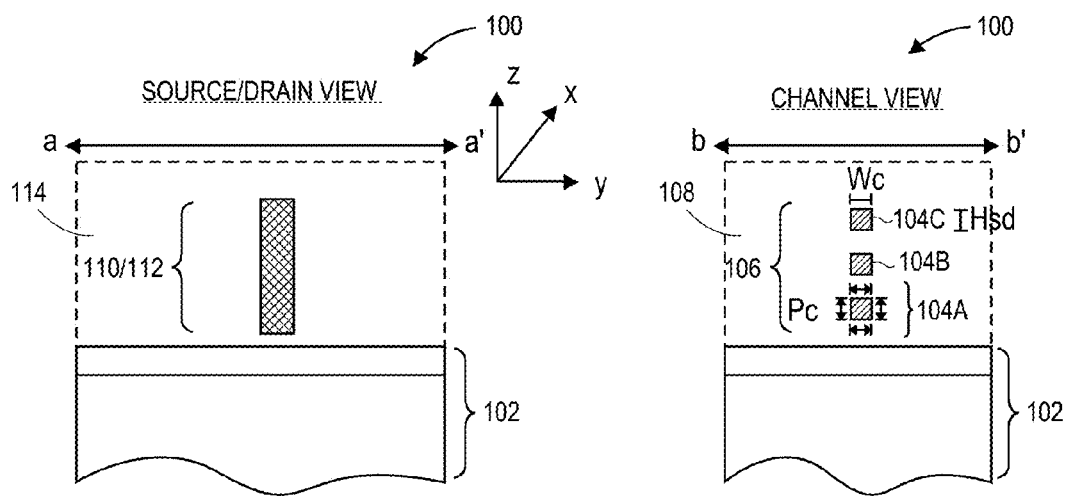
FIG. 1B     FIG. 1C

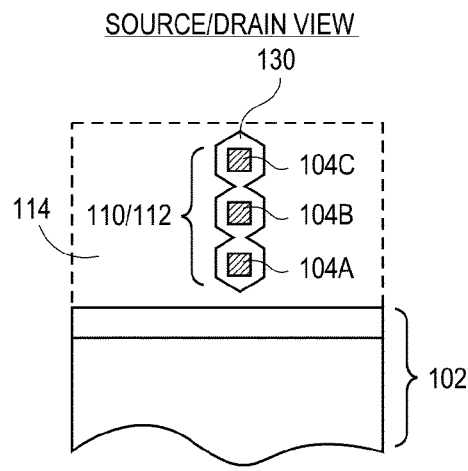 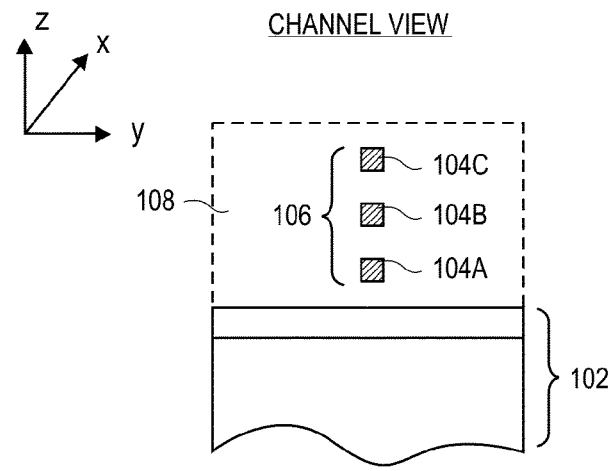
FIG. 2A  FIG. 2B
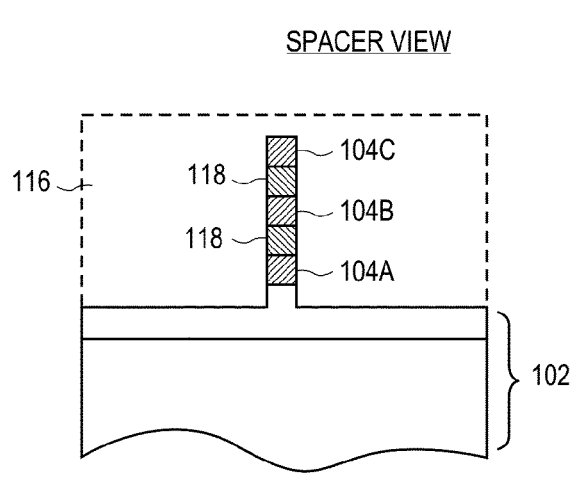
FIG. 3

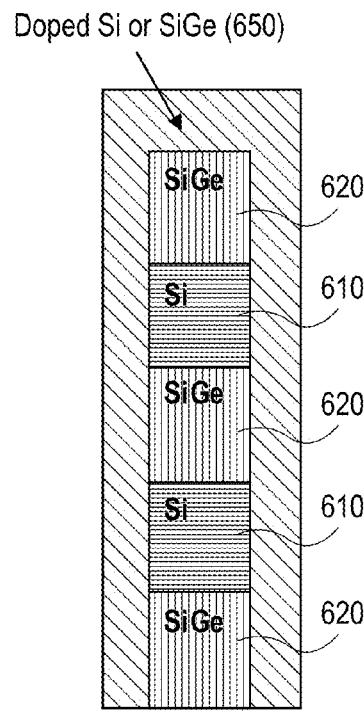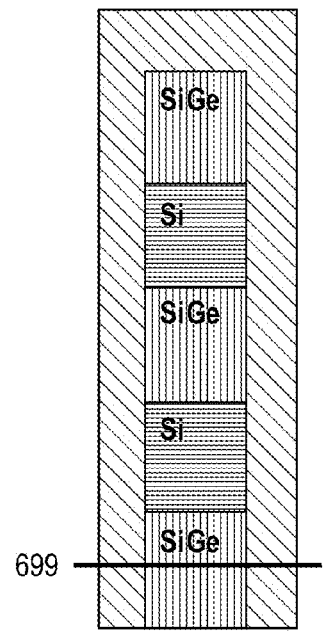
FIG. 6A  FIG. 6B
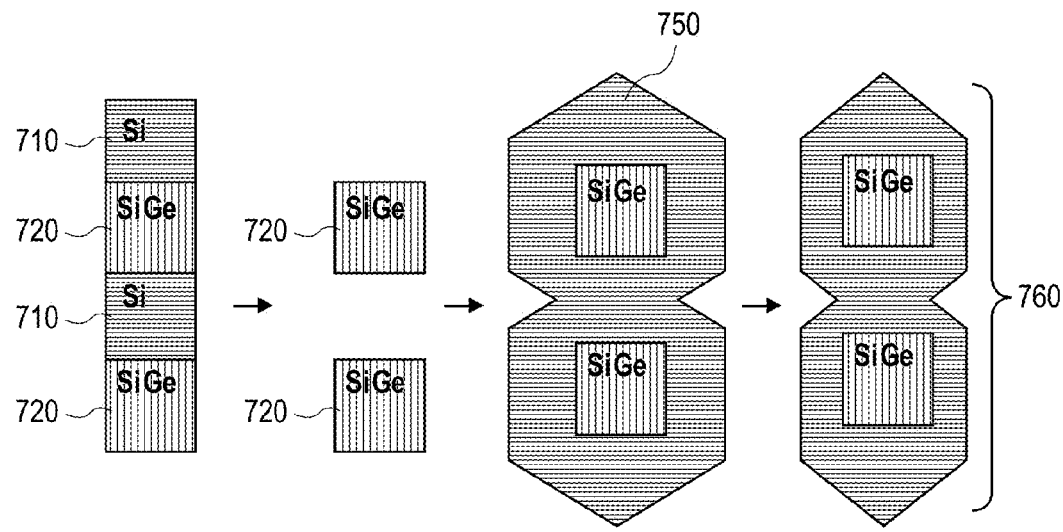
FIG. 7A  FIG. 7B  FIG. 7C  FIG. 7D

NANOWIRE STRUCTURES HAVING NON-DISCRETE SOURCE AND DRAIN REGIONS

CROSS-REFERENCE TO RELATED APPLICATIONS

This application is a divisional of U.S. patent application Ser. No. 13/995,930, filed on Jun. 19, 2013, entitled, "NANOWIRE STRUCTURES HAVING NON-DISCRETE SOURCE AND DRAIN REGIONS," which is a U.S. National Phase Application under 35 U.S.C. §371 of International Application No. PCT/US2011/067232, filed Dec. 23, 2011, entitled "NANOWIRE STRUCTURES HAVING NON-DISCRETE SOURCE AND DRAIN REGIONS," the entire contents of which are hereby incorporated by reference herein.

TECHNICAL FIELD

Embodiments of the invention are in the field of nanowire semiconductor devices and, in particular, nanowire structures having non-discrete source and drain regions.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

Maintaining mobility improvement and short channel control as microelectronic device dimensions scale past the 15 nanometer (nm) node provides a challenge in device fabrication. Nanowires used to fabricate devices provide improved short channel control. For example, silicon germanium ($Si_xGe_{1-x}$) nanowire channel structures (where x<0.5) provide mobility enhancement at respectable Eg, which is suitable for use in many conventional products which utilize higher voltage operation. Furthermore, silicon germanium ($Si_xGe_{1-x}$) nanowire channels (where x>0.5) provide mobility enhanced at lower Egs (suitable for low voltage products in the mobile/handheld domain, for example.

Many different techniques have been attempted to improve external resistance ($R_{ext}$) of transistors including improved contact metals, increased activation of dopant and lowered barriers between the semiconductor and contact metal. However, significant improvements are still needed in the area of $R_{ext}$ reduction.

SUMMARY

Embodiments of the present invention include nanowire structures having non-discrete source and drain regions.

In an embodiment, a semiconductor device includes a plurality of vertically stacked nanowires disposed above a substrate. Each of the nanowires includes a discrete channel region disposed in the nanowire. A gate electrode stack surrounds the plurality of vertically stacked nanowires. A pair of non-discrete source and drain regions is disposed on either side of, and adjoining, the discrete channel regions of the plurality of vertically stacked nanowires.

In another embodiment, a method of fabricating a nanowire semiconductor device includes forming a plurality of vertically stacked nanowires above a substrate. Each of the nanowires includes a discrete channel region disposed in the nanowire. A gate electrode stack is formed to surround the discrete channel regions of the plurality of vertically stacked nanowires. A pair of non-discrete source and drain regions is formed on either side of, and adjoining, the discrete channel regions of the plurality of vertically stacked nanowires.

In another embodiment, a method of fabricating a nanowire semiconductor device includes forming a plurality of vertically stacked nanowires above a substrate. Each of the nanowires includes a discrete channel region disposed in the nanowire. A gate electrode stack is formed to surround the discrete channel regions of the plurality of vertically stacked nanowires. Source and drain regions of each of the plurality of vertically stacked nanowires are removed. A pair of non-discrete source and drain regions is then formed on either side of, and adjoining, the discrete channel regions of the plurality of vertically stacked nanowires.

BRIEF DESCRIPTION OF THE DRAWINGS

FIG. 1A illustrates a three-dimensional cross-sectional view of a nanowire-based semiconductor structure, in accordance with an embodiment of the present invention.

FIG. 1B illustrates a cross-sectional source/drain view of the nanowire-based semiconductor structure of FIG. 1A, as taken along the a-a' axis, in accordance with an embodiment of the present invention.

FIG. 1C illustrates a cross-sectional channel view of the nanowire-based semiconductor structure of FIG. 1A, as taken along the b-b' axis, in accordance with an embodiment of the present invention.

FIG. 2A illustrates a cross-sectional source/drain view of another nanowire-based semiconductor structure, in accordance with an embodiment of the present invention.

FIG. 2B illustrates a cross-sectional channel view of the nanowire-based semiconductor structure of FIG. 2A, in accordance with an embodiment of the present invention.

FIG. 3 illustrates a cross-sectional spacer view of a nanowire-based semiconductor structure, in accordance with an embodiment of the present invention.

FIGS. 6A and 6B illustrate cross-sectional views of various operations in the fabrication of a non-discrete source or drain region of a multi-nanowire structure, in accordance with an embodiment of the present invention.

FIGS. 7A-7D illustrate cross-sectional views of various operations in the fabrication of a non-discrete source or drain region of a multi-nanowire structure, in accordance with an embodiment of the present invention.

DETAILED DESCRIPTION

Figure 4A:
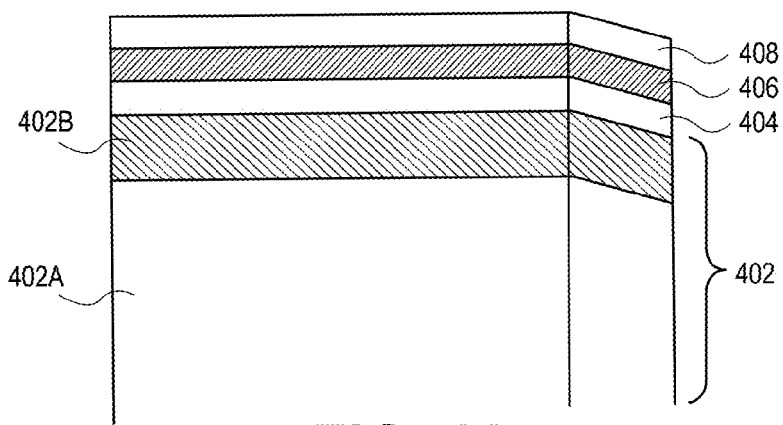
FIGS. 4A-4C illustrate three-dimensional cross-sectional views representing various operations in a method of providing a starting structure for fabricating a nanowire semiconductor device with non-discrete source and drain regions, in accordance with an embodiment of the present invention.

Nanowire structures having non-discrete source and drain regions are described. In the following description, numerous specific details are set forth, such as specific nanowire integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

Nanowire structures with improved (reduced) external resistance and methods to fabricate such structures, e.g., with non-discrete or global source and drain regions used for devices having two or more nanowires, are described herein. One or more embodiments of the present invention are directed at approaches for improving (by increasing) the contact area in non-discrete source and drain regions of a multi-nanowire device or improving the non-discrete source or drain and contact barrier through doping or material engineering, or both. Overall, device performance may be improved by decreasing the external resistance through either increasing the contact area or decreasing the barrier between a metal and semiconductor or between a heavily doped semiconductor and a lightly doped semiconductor.

In an embodiment, a nanowire structure with solid (e.g., non-discrete) source and drain regions exhibits improved (lower) external resistance or channel resistance of a device fabricated there from. One or more embodiments are directed toward one or more of metal source and drain regions, the introduction of increased doping or strain in non-discrete source and drain regions by laser annealing, a zig-zag (e.g., faceted) non-discrete source and drain interface. One or more embodiments are directed to process flow that provide dopants to nanowires or nanowire portions and merge an epitaxially deposited material to provide ultimately omega fin-type or wrap-around contacts.

Embodiments described herein may be directed to process flows and resulting structures unique to nanowire structures, e.g., as distinguished from fin-FET or trigate type architectures. For example, in one embodiment, a melt laser process is used to intermix two materials otherwise used to define alternating nanowires, to dope the nanowires and, possibly, to strain the channel regions of the nanowires. In another embodiment, a metal source and drain region is provided where the source and drain regions are actually replaced with a metal that is in contact with the remaining portions of the nanowires, e.g., by using a contact metal as both a contact and in place of the source and drain regions. Such embodiments may enable the use of undoped wires as well as work function options for optimizing a device formed there from. In another embodiment, a non-discrete source or drain region is fabricated by epitaxial formation and subsequent crystal orientation-dependent etching to provide a structure with increased contact area. In another embodiment, a process flow enables doping of a nanowire that results in merged epitaxial regions in the source and drain regions and, possibly, omega contacts to the source and drain regions. It is to be understood the embodiments described herein, such as the above embodiments, may be used in combination with one another.

One or more embodiments described herein are directed to improving the performance of nanowire-based devices. In an embodiment, a nanowire structure is provided with a contact area (e.g., in the source and drain region) that scales favorably with the number of nanowires. For example, in one embodiment, a nanowire-based structure has a contact area that wraps around a global source or drain region of a plurality of nanowires, providing high contact area for the same pitches. Methods to fabricate such structures are also provided. In one embodiment, metal source and drain regions are provided. The external resistance (contact+bulk) of such devices may be reduced when a metal with a suitably low barrier is selected since the resistance of the metal will be lower than doped silicon.

Overall, one or more approaches described herein may be used to improve drive current in a nanowire-based device by decreasing the external resistance of the device. Exemplary embodiments are provided below.

In a first exemplary embodiment, FIG. 1A illustrates a three-dimensional cross-sectional view of a nanowire-based semiconductor structure. FIG. 1B illustrates a cross-sectional source/drain view of the nanowire-based semiconductor structure of FIG. 1A, as taken along the a-a' axis, in accordance with an embodiment of the present invention. FIG. 1C illustrates a cross-sectional channel view of the nanowire-based semiconductor structure of FIG. 1A, as taken along the b-b' axis, in accordance with an embodiment of the present invention.

Referring to FIG. 1A, a semiconductor device 100 includes one or more vertically stacked nanowires (e.g., 104 set) disposed above a substrate 102. As an example, a three nanowire-based device having nanowires 104A, 104B and 104C is shown for illustrative purposes. For convenience of description, nanowire 104A is used as an example where description is focused on one of the nanowires. It is to be understood that where attributes of one nanowire are described, embodiments based on a plurality of nanowires may have the same attributes for each of the nanowires.

Each of the nanowires 104 includes a channel region 106 disposed in the nanowire. The channel region 106 has a length (L). Referring to FIG. 1C, the channel region also has a perimeter (Pc) orthogonal to the length (L). Referring to both FIGS. 1A and 1C, a gate electrode stack 108 surrounds the entire perimeter (Pc) of each of the channel regions 106. The gate electrode stack 108 includes a gate electrode along with a gate dielectric layer disposed between the channel region 106 and the gate electrode (not shown). The channel region is discrete in that it is completely surrounded by the gate electrode stack 108 without any intervening material such as underlying substrate material or overlying channel fabrication materials. Accordingly, in embodiments having a plurality of nanowires 104, the channel regions 106 of the nanowires are also discrete relative to one another.

Referring to both FIGS. 1A and 1B, the semiconductor device 100 includes a pair of non-discrete source and drain regions 110/112. The pair of non-discrete source and drain regions 110/112 is disposed on either side of the channel regions 106 of the plurality of vertically stacked nanowires 104. Furthermore, the pair of non-discrete source and drain regions 110/112 is adjoining (either directly or indirectly, the latter shown in FIG. 1A) for the channel regions 106 of the plurality of vertically stacked nanowires 104. The source/drain regions 110/112 are non-discrete in that there are not individual and discrete source and drain regions for each channel region 106 of a nanowire 104. In one such example, as will be elaborated below, source/drain regions 110/112 include intervening material such as intervening channel fabrication materials. Accordingly, in embodiments having a plurality of nanowires 104, the source/drain regions 110/112 of the nanowires are global source/drain regions as opposed to discrete for each nanowire.

In accordance with an embodiment of the present invention, and as depicted in FIGS. 1A and 1B, the semiconductor device 100 further includes a pair of contacts 114, each contact 114 disposed on one of the pair of non-discrete source and drain regions 110/112. In one such embodiment, as depicted in FIG. 1B, in a vertical sense, each contact 114 completely surrounds the respective non-discrete source or drain region 110/112.

Referring to FIGS. 1B and 1C, the non-discrete source and drain regions 110/112 are global in the sense that a single unified feature is used as a source or drain region for a plurality (in this case, 3) of nanowires 104 and, more particularly, for more than one discrete channel region 106. In an embodiment, the pair of non-discrete source and drain regions 110/112 is a pair of semiconductor regions composed of a first same semiconductor material as the discrete channel regions 106 and a second, different, semiconductor material. For example, in one such embodiment, the second material is an intervening material used as an intervening material in the fabrication of discrete nanowires. Such an example is described in greater detail in association with FIGS. 4C, 6A and 6B below. In a specific such embodiment, the first and second semiconductor materials are merged, and the semiconductor regions of the non-discrete source and drain regions 110/112 further include a dopant species. Such an example is described in greater detail in association with FIGS. 6A and 6B below. As an overall example, in a particular embodiment, the first semiconductor material is silicon germanium, the second semiconductor material is silicon, and the dopant species is a P-type dopant species. In another particular embodiment, the first semiconductor material is silicon, the second semiconductor material is silicon germanium, and the dopant species is an N-type dopant species. In an embodiment, from a cross-sectional perspective orthogonal to the length of the discrete channel regions 106, each of the pair of non-discrete source and drain regions 110/112 is approximately rectangular in shape, as depicted in FIG. 1B.

In another aspect, the entire perimeter of the non-discrete source and drain regions 110/112 may not be accessible for contact with contacts 114. Using FIG. 1B as a contrasting example, the entire perimeter of the non-discrete source and drain regions 110/112, as taken along the a-a' axis, is surrounded by the contacts 114. In another embodiment, however, access to the bottom of the non-discrete source and drain regions 110/112 is not made, e.g., due to the presence of an intervening dielectric layer, and the contact 114 thus only partially surrounds the non-discrete source and drain regions 110/112. A particular example of such an embodiment is described in association with FIGS. 8C-8F below.

In another aspect, the portions of the nanowires 104A-104C that are in the locations of the source and drain regions are removed and replaced with a metal species, such as a contact metal. In an embodiment, then, the pair of non-discrete source and drain regions actually provides contact to the plurality of vertically stacked nanowires 104A-104C. That is, the contact regions 114, in addition to providing contact, also acts as non-discrete source and drain regions. A particular example of such an embodiment is described in association with FIG. 5 below.

In another aspect, discrete portions of a plurality of nanowires are made to be non-discrete by the addition of a coupling material. As used in another context, in a second exemplary embodiment, FIG. 1A illustrates a three-dimensional cross-sectional view of a nanowire-based semiconductor structure. FIG. 2A illustrates a cross-sectional source/drain view of the nanowire-based semiconductor structure of FIG. 1A, as taken along the a-a' axis, in accordance with another embodiment of the present invention. FIG. 2B illustrates a cross-sectional channel view of the nanowire-based semiconductor structure of FIG. 1A, as taken along the b-b' axis, in accordance with another embodiment of the present invention.

Referring to FIG. 1A, a semiconductor device 100 includes one or more vertically stacked nanowires (e.g., 104 set) disposed above a substrate 102. Each of the nanowires 104 includes a channel region 106 disposed in the nanowire. Referring to both FIGS. 1A and 2B, a gate electrode stack 108 surrounds the entire perimeter of each of the channel regions 106. Referring to both FIGS. 1A and 2A, the semiconductor device 100 includes a pair of non-discrete source and drain regions 110/112. The pair of non-discrete source and drain regions 110/112 is disposed on either side of the channel regions 106 of the plurality of vertically stacked nanowires 104. Furthermore, the pair of non-discrete source and drain regions 110/112 is adjoining for the channel regions 106 of the plurality of vertically stacked nanowires 104. A pair of contacts 114 is also included, each contact 114 disposed on one of the pair of non-discrete source and drain regions 110/112.

Referring to FIG. 2B, in accordance with an embodiment of the present invention, the pair of non-discrete source and drain regions 110/112 is a pair of semiconductor regions composed of a first same semiconductor material as the discrete channel regions 104A-104C and a second, faceted (e.g. zig-zag), semiconductor material 130 at least partially surrounding the first semiconductor material. That is, the second semiconductor material 130 renders the discrete portion of nanowires 104A-104C and non-discrete or global source and drain regions. In one such embodiment, the first (e.g., nanowire material) and second (130) semiconductor materials are the same. A particular example of such an embodiment is described in association with FIG. 7A-7D below.

Referring again to FIG. 1A, in an embodiment, the semiconductor device 100 further includes a pair of spacers 116. The spacers 116 are disposed between the gate electrode stack 108 and a respective one of the pair of non-discrete source and drain regions 110/112. Such spacers 116 are described in greater detain in association with FIG. 3 below.

Substrate 102 may be composed of a material suitable for semiconductor device fabrication. In one embodiment, substrate 102 includes a lower bulk substrate composed of a single crystal of a material which may include, but is not limited to, silicon, germanium, silicon-germanium or a III-V compound semiconductor material. An upper insulator layer composed of a material which may include, but is not limited to, silicon dioxide, silicon nitride or silicon oxynitride is disposed on the lower bulk substrate. Thus, the structure 100 may be fabricated from a starting semiconductor-on-insulator substrate. Alternatively, the structure 100 is formed directly from a bulk substrate and local oxidation is used to form electrically insulative portions in place of the above described upper insulator layer. In another alternative embodiment, the structure 100 is formed directly from a bulk substrate and doping is used to form electrically isolated active regions, such as nanowires, thereon. In one such embodiment, the first nanowire (i.e., proximate the substrate) is in the form of an omega-FET type structure.

In an embodiment, the nanowires 104 may be sized as wires or ribbons and may have squared-off or rounder corners. Referring to 1C, in an embodiment, each of the channel regions 106 has a width (Wc) and a height (Hc), the width (Wc) approximately the same as the height (Hc). That is, the channel regions 106 and the source/drain region 110/112 are square-like or, if corner-rounded, circle-like in cross-section profile. In another embodiment (not shown), however, width and height of the channel region need not be the same. For example, the width (Wc) is substantially greater than the height (Hc). In a specific embodiment, the width Wc is approximately 2-10 times greater than the height Hc. That is, the channel regions 106 and the source/drain region 110/112 are rectangular-like or, if corner-rounded, oval-like in cross-section profile. Nanowires with such geometry may be referred to as nanoribbons. In an alternative embodiment (not shown), the nanoribbons are oriented vertically.

In an embodiment, the nanowires 104 are composed of a material such as, but not limited to, silicon, germanium, or a combination thereof. In one such embodiment, the nanowires are single-crystalline. For example, for a silicon nanowire 104, a single-crystalline nanowire may be based from a (100) global orientation, e.g., with a <100> plane in the z-direction. It is to be understood, however, that other orientations may also be considered. In an embodiment, the dimensions of the nanowires 104, from a cross-sectional perspective, are on the nano-scale. For example, in a specific embodiment, the smallest dimension of the nanowires 104 is less than approximately 20 nanometers. In an embodiment, the nanowires 104 are composed of a strained material, particularly in the channel regions 106.

In an embodiment, the gate electrode of gate electrode stack 108 is composed of a metal gate and the gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the nanowire 104. In an embodiment, the gate dielectric layer is comprised of a top high-k portion and a lower portion composed of an oxide of a semiconductor material. In one embodiment, the gate dielectric layer is composed of a top portion of hafnium oxide and a bottom portion of silicon dioxide or silicon oxy-nitride.

In one embodiment, the gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer.

In an embodiment, the spacers 116 are composed of an insulative dielectric material such as, but not limited to, silicon dioxide, silicon oxy-nitride or silicon nitride. The contacts 114 are, in an embodiment, fabricated from a metal species. The metal species may be a pure metal, such as nickel or cobalt, or may be an alloy such as a metal-metal alloy or a metal-semiconductor alloy (e.g., such as a silicide material).

As described above, the channel regions are, in at least several embodiments, made to be discrete while the source and drain regions are not. However, other regions of the nanowire need not, or even can, be made to be discrete. For example, FIG. 3 illustrates a cross-sectional spacer view of a nanowire-based semiconductor structure, in accordance with an embodiment of the present invention.

Referring to FIG. 3, nanowires 104A-104C are not discrete at the location under spacers 116. In one embodiment, the stack of nanowires 104A-104C have intervening semiconductor material 118 there between, such as silicon germanium intervening between silicon nanowires, or vice versa, as described below in association with FIG. 4B. In one embodiment, the bottom nanowire 104A is still in contact with a portion of substrate 102. Thus, in an embodiment, a portion of the plurality of vertically stacked nanowires under one or both of the spacers is non-discrete, either between nanowires, below the bottom nanowire 104A, or both.

In another aspect, methods of fabricating a nanowire semiconductor device are provided. For example, FIGS. 4A-4C illustrate three-dimensional cross-sectional views representing various operations in a method of providing a starting structure for fabricating a nanowire semiconductor device with non-discrete source and drain regions, in accordance with an embodiment of the present invention.

A method of fabricating a nanowire semiconductor device may include forming a nanowire above a substrate. In a specific example showing the formation of two silicon nanowires, FIG. 4A illustrates a substrate 402 (e.g., composed of a bulk substrate silicon substrate 402A with an insulating silicon dioxide layer 402B there on) having a silicon layer 404/silicon germanium layer 406/silicon layer 408 stack disposed thereon. It is to be understood that, in another embodiment, a silicon germanium layer/silicon layer/silicon germanium layer stack may be used to ultimately form two silicon germanium nanowires.

Figure 4B:
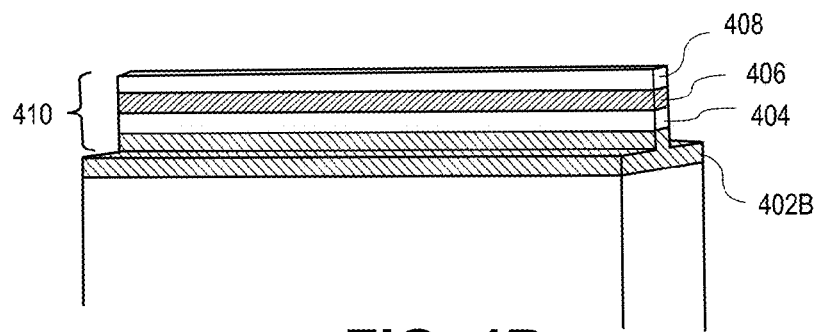
Figure 4C:
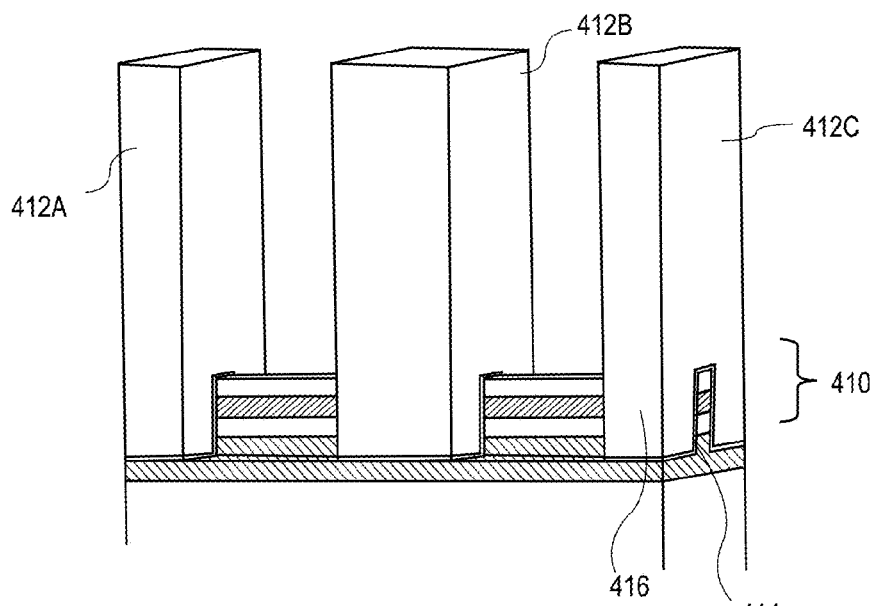

Referring to FIG. 4B, a portion of the silicon layer 404/silicon germanium layer 406/silicon layer 408 stack as well as a top portion of the silicon dioxide layer 402B is patterned into a fin-type structure 410, e.g., with a mask and plasma etch process.

The method may also include forming a channel region in the nanowire, the channel region having a length and a perimeter orthogonal to the length. In a specific example showing the formation of three gate structures over the two silicon nanowires, FIG. 4C illustrates the fin-type structure 410 with three sacrificial gates 412A, 412B, and 412C disposed thereon. In one such embodiment, the three sacrificial gates 412A, 412B, and 412C are composed of a sacrificial gate oxide layer 414 and a sacrificial polysilicon gate layer 416 which are blanket deposited and patterned with a plasma etch process.

Although not depicted, following patterning to form the three sacrificial gates 412A, 412B, and 412C, spacers may be formed on the sidewalls of the three sacrificial gates 412A, 412B, and 412C, doping may be performed (e.g., tip and/or source and drain type doping), and an interlayer dielectric layer may be formed to cover the three sacrificial gates 412A, 412B, and 412C. The interlayer dielectric layer may be polished to expose the three sacrificial gates 412A, 412B, and 412C for a replacement gate, or gate-last, process. Additionally, the portions of the silicon germanium layer 406 and the portion of the insulating silicon dioxide layer 402B of the fin structure 410 may be removed in the regions originally covered by the three sacrificial gates 412A, 412B, and 412C. Discrete portions of the silicon layers 404 and 408 thus remain. Or, in the opposite case, discrete portions of two silicon germanium layers remain, if staring with a reverse stack of silicon and silicon germanium layers.

The discrete portions of the silicon layers 404 and 408 will, in one embodiment, ultimately become channel regions in a nanowire-based device. Thus, at this process stage, channel engineering or tuning may be performed. For example, in one embodiment, the discrete portions of the silicon layers 404 and 408 formed are thinned using oxidation and etch processes. Such an etch process may be performed at the same time the wires are separated by etching the silicon germanium layer 406. Accordingly, the initial wires formed from silicon layers 404 and 408 begin thicker and are thinned to a size suitable for a channel region in a nanowire device, independent from modifying the source and drain regions of the device.

Initial processing may also include forming a gate electrode stack surrounding the entire perimeter of the channel region. In the specific example showing the formation of three gate structures over the two silicon nanowires, a gate dielectric layer (such as a high-k gate dielectric layer) and a gate electrode layer (such as a metal gate electrode layer) are formed. Additionally, subsequent removal of any interlayer dielectric layer after formation of the permanent gate stack may be performed, providing access to the source and drain regions.

The method may also include forming a pair of non-discrete source and drain regions for the nanowires, on either side of the channel regions. Thus, source and drain region fabrication and engineering or tuning may be performed, example of which follow. It is to be understood that similar engineering or tuning may instead be performed earlier in a process flow, e.g., prior to deposition of an inter-layer dielectric layer and formation of permanent gate electrodes.

Figure 5:
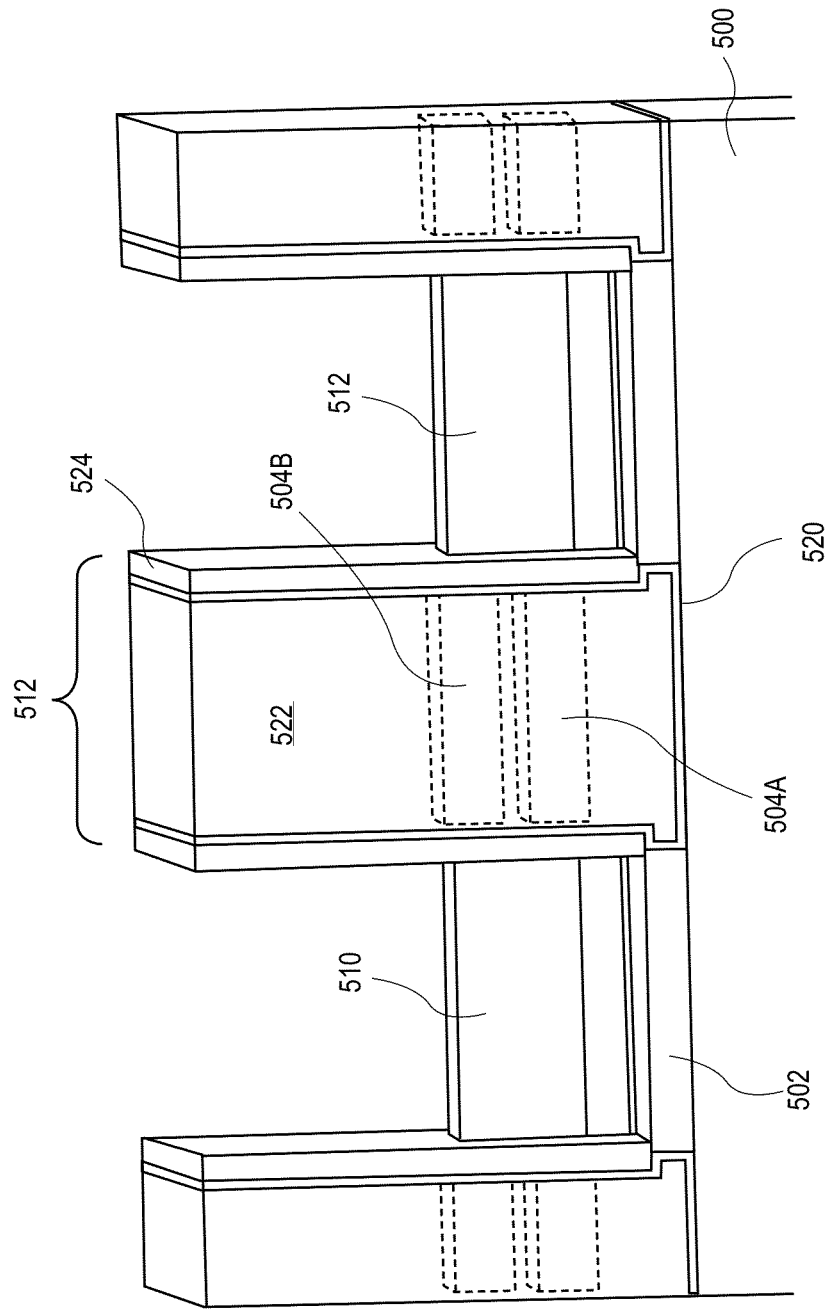
FIG. 5 illustrates a three-dimensional cross-sectional view of a nanowire semiconductor device with metal regions, such as contact region, as non-discrete source and drain regions, in accordance with an embodiment of the present invention.

In a first example, starting with the structure of FIG. 4C as a starting point, FIG. 5 illustrates a three-dimensional cross-sectional view of a nanowire semiconductor device with metal regions, such as contact region, as non-discrete source and drain regions, in accordance with an embodiment of the present invention.

Referring to FIG. 5, a gate electrode stack 512 includes a gate dielectric layer 520, a gate electrode 522 and sidewall spacers 524. The gate electrode stack surrounds discrete nanowire channel regions 504A/B. A pair of non-discrete source and drain regions 510 and 512 adjoin the discrete channel regions 504A/B. A buried oxide layer 502 isolates a substrate 500. It is to be understood that the concepts herein are applicable to wires both on bulk or on under fin oxide structures, such as an underlying omega-FET device. In an embodiment, the pair of non-discrete source and drain regions 510 and 512 effectively contact regions that do not include nanowire material. In one such embodiment, the contacts are formed from a metallic species. In a specific such embodiment, the metallic species is formed by conformally depositing a contact metal and then filling any remaining trench volume. The conformal aspect of the deposition may be performed by using chemical vapor deposition (CVD), atomic layer deposition (ALD), or metal reflow. Thus, the structure of FIG. 5 may be viewed as having contacts that contact the ends of nanowires (as opposed to merely surrounding nanowires).

In an embodiment, to achieve the structure of FIG. 5 from the structure of FIG. 4C, a spacer is formed and the silicon regions in the source/drain opening are selectively etched, leaving the silicon germanium layers to remain. Additional silicon germanium is then grown epitaxially on top of the existing silicon germanium wires. The silicon germanium may also be doped and annealed to drive dopants into the adjacent silicon wire surface under the spacer. The process flow continues as before with the formation of an interlayer dielectric material and formation of the gate electrode stack. When the interlayer dielectric material in the source/drain regions is removed, the silicon germanium epitaxial layer is exposed and then etched to leave a cavity open to the ends of the silicon nanowires going into the spacer. The contact metal is then deposited to fill the cavity and make with the ends of the silicon nanowires. In one such embodiment, this approach is applicable to metallization contact schemes with very low interface barrier height where the small contact area is not a significant penalty. In another embodiment, an alternative process flow includes etch-out of both the silicon and silicon germanium wires followed by fill with a metal at the source and drain regions or another temporary material that is subsequently removed by etch at a trench contact fabrication operation.

In one or more methods described herein, in addition to providing electrical contact, the contact metal and deposition process may be chosen such that the metal induces an appropriate strain on the channel nanowires to enhance the device performance. For example, in one embodiment, e.g., in the special case of an undoped wire, a midgap workfunction metal is used to fabricate contacts without requiring a high doping level at the metal to source/drain interface.

A variation of the above process flow may be used to dope or increase the straining atom concentration in the silicon (or, alternatively, silicon germanium) source and drain regions of the nanowires using a melt laser anneal, or other effective anneal. FIGS. 6A and 6B illustrate cross-sectional views of various operations in the fabrication of a non-discrete source or drain region of a multi-nanowire structure, in accordance with an embodiment of the present invention.

For example, using the structure of FIG. 4C as a starting point, spacers are first formed on the gate stacks 412A-412C. Referring to FIG. 6A, either the silicon regions 610 or the silicon germanium regions 620 are the ends of nanowires, with the other material an intervening material used in the fabrication of the nanowires. A doped silicon or silicon germanium layer 650 is selectively deposited around the source and drain regions, e.g., surrounding the exposed portions of the stack of regions 610 and 620. Referring to FIG. 6B, an amorphization depth 699 is formed following a high dose implant of the structure of FIG. 6A. In an embodiment, a melt laser anneal process (possibly including deposition of temporary layers that provide support during the melt) is used to melt all the amorphous layers above the amorphization depth 699. In another embodiment, a non-laser based anneal is used. In one such embodiment, melting causes a redistribution of the atoms in the melted layers. The deposited layers may then be doped since the implanted dopant redistributes into the layers 610 and 620, decreasing the resistance of an ultimately formed non-discrete source or drain region. In an embodiment, when the deposited layers include a straining atom, such as germanium or carbon, the resulting strain in the non-discrete source or drain region is used to increase the strain in the corresponding discrete channel regions. For example, in a particular embodiment, a Ge:B film (as 650) is deposited and melted. As such, the Ge and B concentrations in the portions of a non-discrete source or drain region in line with the nanowires is increased. The increased Ge acts to strain the PMOS channels of either silicon or silicon germanium. Such an option may not be compatible with a contact-all-around structure since the source and drain region would have a uniform Ge concentration.

Another option for improving the resistance of nanowire-based structures may involve increasing the contact area for multiple nanowires by exposing facets, such as <111> facets, of a semiconductor material. For example, FIGS. 7A-7D illustrate cross-sectional views of various operations in the fabrication of a non-discrete source or drain region of a multi-nanowire structure, in accordance with an embodiment of the present invention.

For example, using the structure of FIG. 4C as a starting point, spacers are first formed on the gate stacks 412A-412C. Referring to FIG. 7A, either the silicon regions 710 or the silicon germanium regions 720 are the ends of nanowires, with the other material an intervening material used in the fabrication of the nanowires. In the specific case shown, the silicon germanium regions 720 are the ends of nanowires.

Referring to FIG. 7B, the silicon regions 710 are selectively removed to leave the silicon germanium ends 720 of the nanowires remaining. A silicon germanium layer 750 is selectively deposited around the source and drain regions, e.g., surrounding the exposed portions of the silicon germanium regions 720, as depicted in FIG. 7C. Referring to FIG. 7D, an orientation dependent etch, such as KOH, is used to further expose the <111> planes and increase the area for contact to the non-discrete source or drain region 760. In an embodiment, the resulting zig-zag contact source or drain structure increases the contact area which decreases the external resistance of a device fabricated there from. In an embodiment, a subsequently formed contact metal wraps around the non-discrete source or drain region 760 so that it contacts both the side and top of the non-discrete source or drain region 760, increasing the contact metal source or drain contact area.

In another embodiment, a process flow suitable for doping and providing contact to source or drain regions of nanowires includes fabricating the wires in non-discrete source and drain regions following spacer formation (e.g., starting with the structure of FIG. 4C followed by spacer material deposition and etch). Subsequently, an internal spacer is added, source/drain dopants are added or the region are epitaxially grown. The resulting structure is then filled with a sacrificial dielectric, such as silicon dioxide, that is removed at a later processing operation. Such an alternative option may be used to facilitate ease of doping of the source and drain regions of the nanowires. As an exemplary process flow, FIGS. 8A-8F illustrate cross-sectional views of various operations in the fabrication of a non-discrete source or drain region of a multi-nanowire structure, in accordance with an embodiment of the present invention.

Figure 8A:
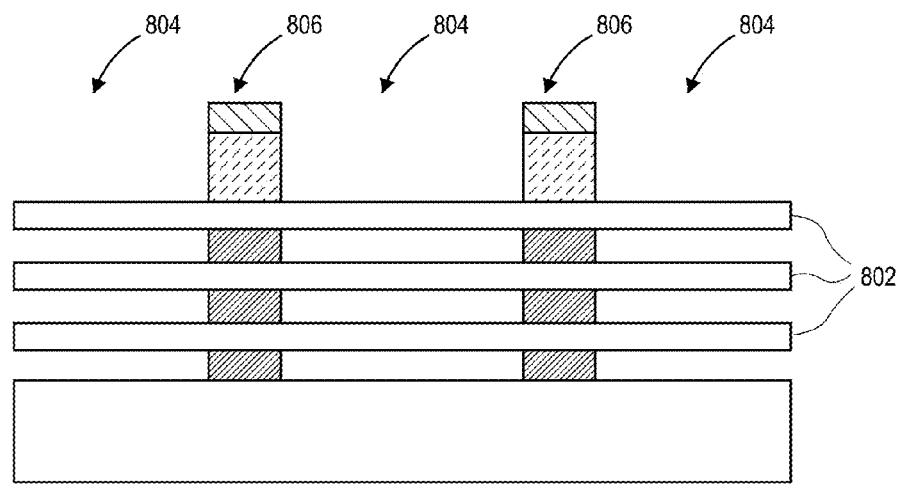
FIGS. 8A-8F illustrate cross-sectional views of various operations in the fabrication of a non-discrete source or drain region of a multi-nanowire structure, in accordance with an embodiment of the present invention.
Figure 8B:
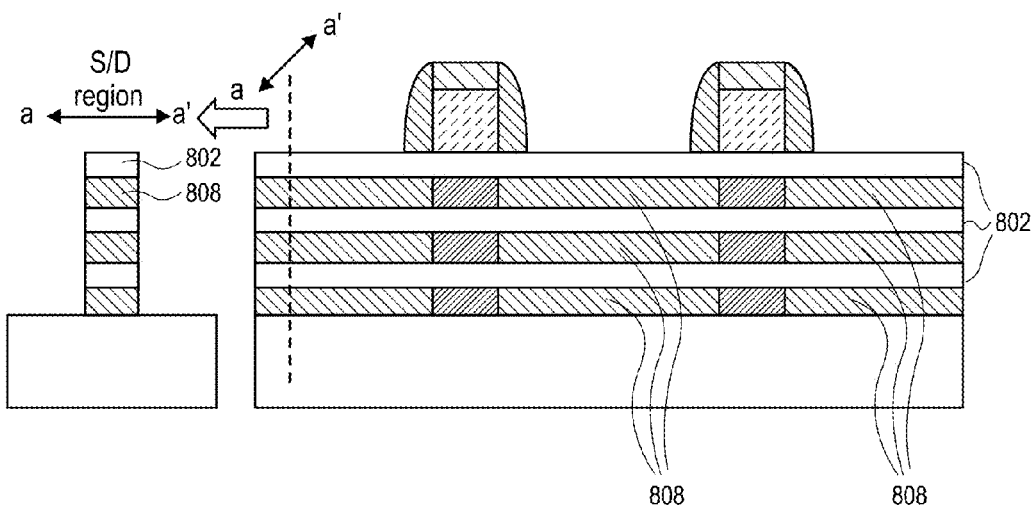
Figure 8C:
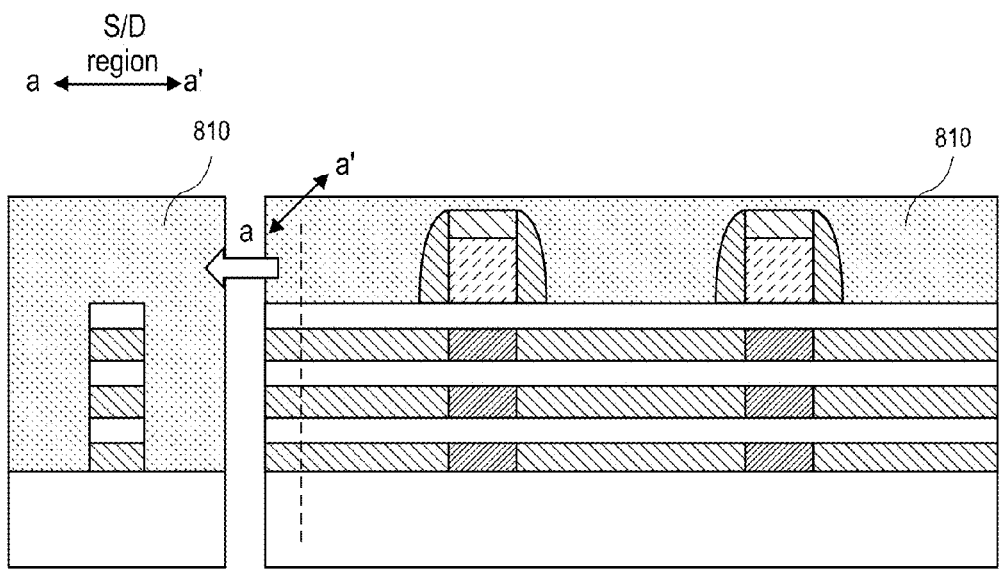
Figure 8D:
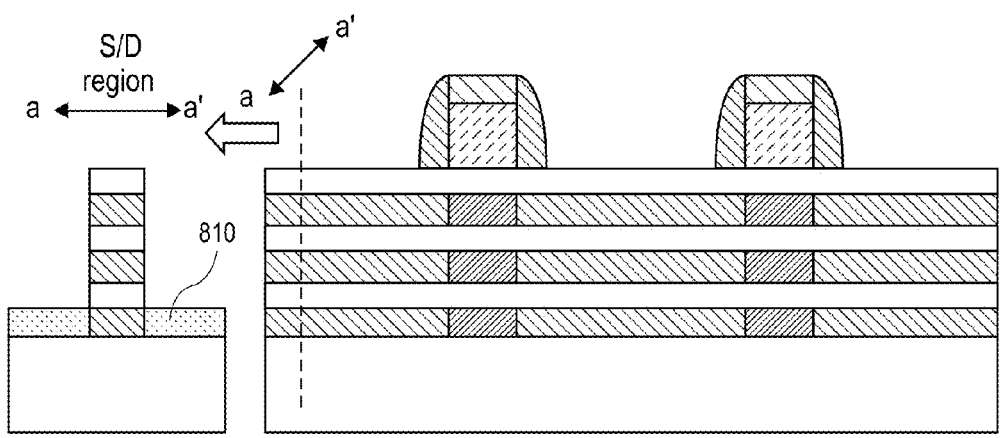
Figure 8E:
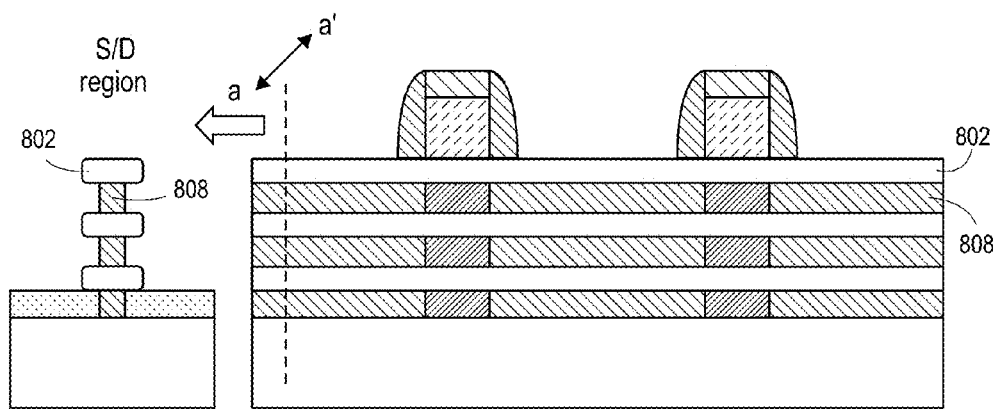
Figure 8F:
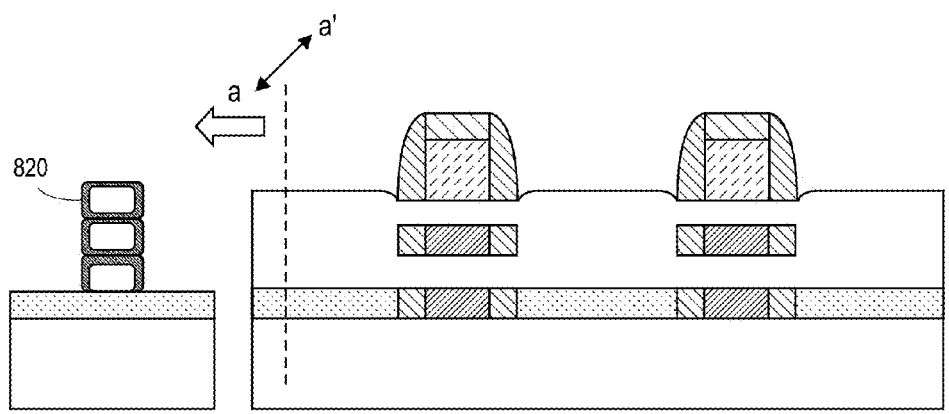

Referring to FIG. 8A, fin or wire 802 cuts are provided for a structure such as the structure of FIG. 4C in source/drain regions 804 between gate or gate placeholder regions 806. For example, a spacer may be added to the structure of FIG. 4C following removal of the silicon germanium layers in the source and drain regions 804. A dielectric layer 808 is then formed to fill any open tranches or cavities, as depicted in FIG. 8B. Referring to FIG. 8C, a source/drain region isolation layer 810 is formed. The source/drain region isolation layer 810 is then recessed, as depicted in FIG. 8D. Referring to FIG. 8E, the dielectric layer 808 is recessed under the wires 802 to expose more surface area of the wires 802. In some cases, all the dielectric layer 808 is removed. Such an approach may include formation of an internal spacer to separate the source and drain region from the silicon germanium layer residing under the channel portions. An epitaxial layer 820 is then formed on the source and drain portions of the wires 802, as depicted in FIG. 8F. Surrounding the source and drain regions with a doped epitaxial layer may, in an embodiment, enable doping of the source and drain regions of the wires 802 wires and setting the doping level between the wires and the contact metal.

Following the above process flow, contact metal may be added after trench contact etch. The above example of FIGS. 8A-8F can, in an embodiment, be used for nanowire structures formed either on a bulk semiconductor substrate or on an isolated substrate, such as a silicon-on-insulator substrate. The operations described in association with FIGS. 8B and 8C may only be needed in the case of a bulk substrate.

Accordingly, one or more embodiments of the present invention include methods to fabricate nanowire structures with non-discrete source and drain regions, methods of tuning the channel and contact locations (i.e., source and drain regions) areas differently, or methods of doing both in the same process. Structures formed from such methods may provide external resistance (Rext) improvements (reduction) versus conventional structures. Embodiments include providing increased doping in the source and drain regions (or fabricating metal source and drain regions), increasing the contact area or increase the strain in the channel of the device, or both. Such approaches may improve the performance of a device fabricated from the nanowire structures described.

Figure 9:
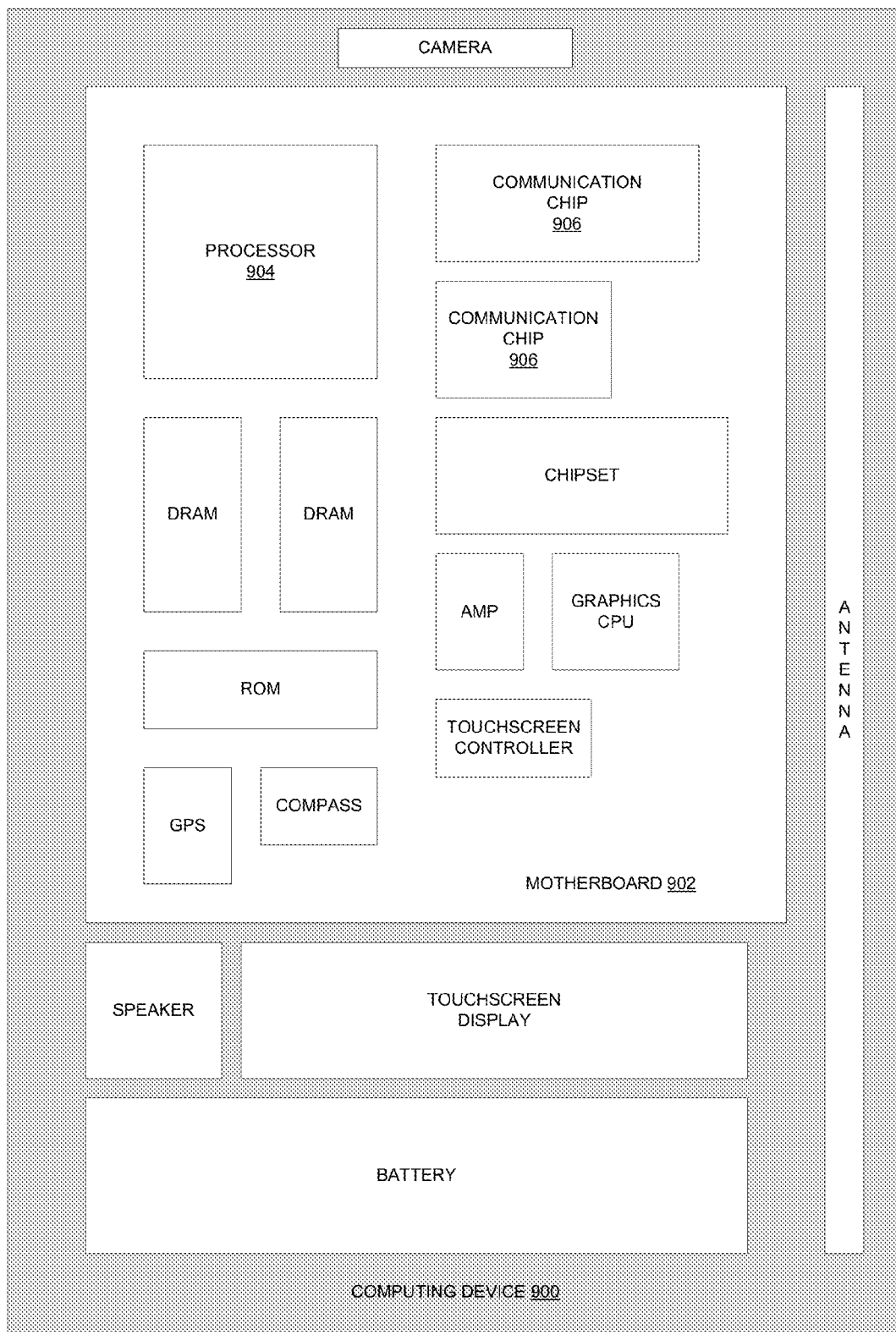
FIG. 9 illustrates a computing device in accordance with one implementation of the invention.

FIG. 9 illustrates a computing device 900 in accordance with one implementation of the invention. The computing device 900 houses a board 902. The board 902 may include a number of components, including but not limited to a processor 904 and at least one communication chip 906. The processor 904 is physically and electrically coupled to the board 902. In some implementations the at least one communication chip 906 is also physically and electrically coupled to the board 902. In further implementations, the communication chip 906 is part of the processor 904.

Depending on its applications, computing device 900 may include other components that may or may not be physically and electrically coupled to the board 902. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi and Bluetooth and a second communication chip 906 may be dedicated to longer range wireless communications such as GPS, EDGE, GPRS, CDMA, WiMAX, LTE, Ev-DO, and others.

The processor 904 of the computing device 900 includes an integrated circuit die packaged within the processor 904. In some implementations of the invention, the integrated circuit die of the processor includes one or more devices, such as nanowire transistors built in accordance with implementations of the invention. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In accordance with another implementation of the invention, the integrated circuit die of the communication chip includes one or more devices, such as nanowire transistors built in accordance with implementations of the invention.

In further implementations, another component housed within the computing device 900 may contain an integrated circuit die that includes one or more devices, such as nanowire transistors built in accordance with implementations of the invention.

In various implementations, the computing device 900 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 900 may be any other electronic device that processes data.

Thus, nanowire structures having non-discrete source and drain regions have been disclosed. In an embodiment, a semiconductor device includes a plurality of vertically stacked nanowires disposed above a substrate. Each of the nanowires includes a discrete channel region disposed in the nanowire. A gate electrode stack surrounds the plurality of vertically stacked nanowires. A pair of non-discrete source and drain regions is disposed on either side of, and adjoining, the discrete channel regions of the plurality of vertically stacked nanowires. In one embodiment, the semiconductor device further includes a pair of contacts, each contact disposed on one of the pair of non-discrete source and drain regions. In one embodiment, the pair of non-discrete source and drain regions provides contact to the plurality of vertically stacked nanowires.

What is claimed is:

1. A method of fabricating a nanowire semiconductor device, the method comprising:
   forming a plurality of vertically stacked nanowires above a substrate, each of the nanowires comprising a discrete channel region disposed in the nanowire;
   forming a gate electrode stack surrounding the discrete channel regions of the plurality of vertically stacked nanowires;
   forming a pair of non-discrete source and drain regions on either side of, and adjoining, the discrete channel regions of the plurality of vertically stacked nanowires, each of the non-discrete source and drain regions having an uppermost surface, sidewall surfaces and a bottommost surface; and
   subsequent to forming the pair of non-discrete source and drain regions, forming a first conductive contact on and continuous around the uppermost surface, the sidewall surfaces and the bottommost surface of the non-discrete source region, and forming a second conductive contact on and continuous around the uppermost surface, the sidewall surfaces and the bottommost surface of the non-discrete drain region.

2. The method of claim 1, wherein forming the pair of non-discrete source and drain regions comprises first forming discrete source and drain regions for each of the nanowires.

3. The method of claim 2, wherein forming the pair of non-discrete source and drain regions comprises forming a faceted semiconductor material at least partially surrounding the discrete source and drain regions of each of the nanowires.

4. The method of claim 1, wherein forming the pair of non-discrete source and drain regions comprises melting, by laser anneal, a portion of vertically stacked nanowires of a first semiconductor material along with an intervening second semiconductor material and a surrounding semiconductor layer.

5. The method of claim 1, wherein the non-discrete source and drain regions are formed prior to forming the discrete channel regions.

6. The method of claim 1, wherein the non-discrete source and drain regions are formed subsequent to forming the discrete channel regions.

7. A method of fabricating a nanowire semiconductor device, the method comprising:
   forming a plurality of vertically stacked nanowires above a substrate, each of the nanowires comprising a discrete channel region disposed in the nanowire;
   forming a gate electrode stack surrounding the discrete channel regions of the plurality of vertically stacked nanowires;
   removing source and drain regions of each of the plurality of vertically stacked nanowires;
   forming a pair of non-discrete source and drain regions on either side of, and adjoining, the discrete channel regions of the plurality of vertically stacked nanowires, each of the non-discrete source and drain regions having an uppermost surface, sidewall surfaces and a bottommost surface; and
   subsequent to forming the pair of non-discrete source and drain regions, forming a first conductive contact on and continuous around the uppermost surface, the sidewall surfaces and the bottommost surface of the non-discrete source region, and forming a second conductive contact on and continuous around the uppermost surface, the sidewall surfaces and the bottommost surface of the non-discrete drain region.

8. The method of claim 7, wherein the pair of non-discrete source and drain regions provides contact to the plurality of vertically stacked nanowires.

9. The method of claim 8, wherein the pair of non-discrete source and drain regions consists essentially of metal.

* * * * *